(12) United States Patent
Rao et al.

(10) Patent No.: US 7,682,956 B2
(45) Date of Patent: Mar. 23, 2010

(54) THREE-DIMENSIONAL METAL MICROFABRICATION PROCESS AND DEVICES PRODUCED THEREBY

(75) Inventors: Masaru P. Rao, Santa Barbara, CA (US); Marco F. Aimi, Menands, NY (US); Noel C. MacDonald, Santa Barbara, CA (US)

(73) Assignee: The Regents of the University of California, Oakland, CA (US)

( * ) Notice: Subject to any disclaimer, the term of this patent is extended or adjusted under 35 U.S.C. 154(b) by 882 days.

(21) Appl. No.: 11/445,067

(22) Filed: Jun. 1, 2006

(65) Prior Publication Data

US 2007/0039170 A1    Feb. 22, 2007

Related U.S. Application Data

(60) Provisional application No. 60/686,409, filed on Jun. 2, 2005.

(51) Int. Cl.
  H01L 21/3205   (2006.01)
  H01L 21/4763   (2006.01)
(52) U.S. Cl. .................. 438/595; 438/763; 257/E21.32; 257/E21.218; 257/E21.227; 257/E21.229; 257/E21.231; 257/E21.245; 257/E21.253; 257/E21.278
(58) Field of Classification Search .................. 257/347, 257/595, 760, 763
See application file for complete search history.

(56) References Cited

U.S. PATENT DOCUMENTS 6,487,001 B2 * 11/2002 Greywall .................... 359/292
6,552,840 B2 * 4/2003 Knipe ......................... 359/291
6,825,967 B1 * 11/2004 Chong et al. ................. 359/290
6,825,968 B2 * 11/2004 Aubuchon .................... 359/290
2004/0207074 A1 * 10/2004 MacDonald et al. .......... 257/708

OTHER PUBLICATIONS

Gottscho, R.A. et al., "Microscopic uniformity in plasma etching," J. Vac. Sci. Technol. B, (1992), pp. 2133-2147, vol. 10(5).
O'Shea, D.C. et al., "Gray-scale masks for diffractive-optics fabrication: II. Spatially filtered halftone screens," Applied Optics, (1995), pp. 7518-7526, vol. 34(32).
Waits, C.M. et al., "Investigation of gray-scale technology for large area 3D silicon MEMS structures," J. of Micromechanics and Microengineering, (2003), pp. 170-177, vol. 13.

(Continued)

*Primary Examiner*—David Nhu
(74) *Attorney, Agent, or Firm*—Gates & Cooper LLP

(57) ABSTRACT

The present invention relates, in general, to a method for three-dimensional (3D) microfabrication of complex, high aspect ratio structures with arbitrary surface height profiles in metallic materials, and to devices fabricated in accordance with this process. The method builds upon anisotropic deep etching methods for metallic materials previously developed by the inventors by enabling simplified realization of complex, non-prismatic structural geometries composed of multiple height levels and sloping and/or non-planar surface profiles. The utility of this approach is demonstrated in the fabrication of a sloping electrode structure intended for application in bulk micromachined titanium micromirror devices, however such a method could find use in the fabrication of any number of other microactuator, microsensor, microtransducer, or microstructure devices as well.

9 Claims, 9 Drawing Sheets

OTHER PUBLICATIONS

Aimi, M.F. et al., "High-Aspect-Ratio Bulk Micromachining of Titanium," Nature Materials, Feb. 2004, pp. 103-105, vol. 3.
Chou, T.-K.A. et al., "Fabrication of Out-of-Plane Curved Surfaces in Si by Utilizing RIE Lag," MEMS 2002, pp. 145-148.
Parker, E.R. et al., "High-Aspect-Ratio Inductively Coupled Plasma Etching of Bulk Titanium for MEMS Applications," 206th Intl. Meeting of the Electrochemical Society: Microfabricated Systems and MEMS VII Symposium, Oct. 3-8, 2004, pp. 96-107.
Rao, M.P. et al., "Bulk Micromachined Titanium Micromirror Device With Sloping Electrode Geometry," Hilton Head, 2004, pp. 224-227.

* cited by examiner (a) Sloping electrode    Inter-    Bonding
                         connect   frame (b)

(c)    Mirror/electrode gap

■ TiO$_2$ mask    ☐ Bulk titanium

THREE-DIMENSIONAL METAL MICROFABRICATION PROCESS AND DEVICES PRODUCED THEREBY

CROSS-REFERENCE TO RELATED APPLICATIONS

This application claims benefit under 35 U.S.C §119(e) of the following and commonly-assigned provisional application:

Application Ser. No. 60/686,409, entitled "THREE-DIMENSIONAL MICROFABRICATION PROCESS AND DEVICES PRODUCED THEREBY," filed on Jun. 2, 2005, by Masaru P. Rao, Marco F. Aimi, and Noel C. MacDonald, which application is incorporated by reference herein.

STATEMENT REGARDING FEDERALLY SPONSORED RESEARCH AND DEVELOPMENT

This invention was made with Government support under Grant No. W9113M-04-01-0001 awarded by the Army Research Office, and Grant Nos. W9113M-04-01-D001 awarded by DARPA. The Government has certain rights in this invention.

BACKGROUND OF THE INVENTION

1. Field of the Invention

The present invention is related to metallic micromechanical materials, methods, and devices, and more particularly, to the fabrication of three-dimensional metallic micromechanical devices.

2. Description of the Related Art (Note: This application references a number of different publications as indicated throughout the specification by one or more reference numbers within brackets, e.g., [Ref. x]. A list of these different publications ordered according to these reference numbers can be found below in the section entitled "References." Each of these publications is incorporated by reference herein.)

Metallic micromachining processes generally fall into one of two classes: 1) those based on extension of conventional machining technology to the micro-scale, such as micromilling and microelectro-discharge machining; and 2) those derived from microelectronics microfabrication technology, such electrodeposition, electrochemical etching, and recently developed plasma-based deep etching methods (initial cyclic metal etching patent application, Aimi & MacDonald, Patent US2004/0207074; and monocyclic metal etching provisional patent, Parker, Rao, & MacDonald, patent Ser. No. 10/832, 559). In general, microelectronics-derived metallic micromachining techniques offer superior resolution, tolerance, accuracy, reproducibility, and surface finish, due in large part to their reliance upon high resolution photolithographic patterning techniques. Microelectronics-derived metallic micromachining techniques also offer greater potential for scalability to low-cost, high volume production, due to their exploitation of the massively parallel, batch processing paradigm of microelectronics manufacturing.

Microelectronics-based metallic micromachining techniques, however, do not provide the same degree of design freedom as conventionally-based multi-axis micromachining techniques. This is because the inherently 2D nature of photolithography limits the complexity of the structures that can be produced to prismatic structures that are simply 3D projections of the 2D photolithographic patterns. Greater structural complexity can be achieved with additional photolithographic patterning steps, bonding of additional substrates, and/or use of sacrificial layers, but this often complicates processing and therefore increases cost and reduces yield considerably. Consequently, need exists for development of simpler metallic microfabrication techniques that provide greater structural design freedom, but still retain the advantageous features of microelectronics-derived micromachining processes, viz. superior resolution, tolerance, accuracy, reproducibility, and surface finish, and greater potential for scalability to low-cost, high volume production.

SUMMARY OF THE INVENTION

The present invention is directed to a fabrication process which utilizes the Reactive Ion Etching (RIE) lag phenomenon to enable simplified fabrication of metallic micro-scale structures with relatively arbitrary surface height profiles. This is accomplished through utilization of a photolithographic etch mask composed of a plurality of openings. Deliberate variation of the size, shape, and/or pitch of these openings enables modulation of the etch depths within each opening. Removal of the superstructure above the etched floors then produces the desired non-prismatic structures produced by the modulation of the etch depth. Moreover, by utilizing mask openings that are separated by line segments of uniform, fixed width throughout the pattern, the simultaneous removal of all superstructures is made possible, thereby simplifying the timing of such process and minimizing the detrimental effect such processes may have on other structures within the device.

As will be discussed in the preferred embodiments, in many cases the entirety of desired device structures could be defined using only a single masking step, thus eliminating the need for lithographic patterning on surfaces with large topographic variation and/or delicate thin-section or released structures. Furthermore, elimination of the masking steps commonly needed for creation of electrically active surfaces could also be achieved through exploitation of the poor coverage conformality of methods such as e-beam deposition, thus simplifying fabrication even further. The versatility of the above described processes is demonstrated by the fabrication of a titanium sloping electrode structure intended for use in high speed, large displacement optical micromirror or other microdevice applications.

A method in accordance with the present invention comprises defining a desired device component structure on a substrate using an etch mask on a metallic substrate using patterns comprising a plurality of openings, a size of each of the plurality of openings defining the etch rate, selectively removing material within the mask openings by etching material within the plurality of openings to create a plurality of floors substantially defined by the mask openings, removing the etch mask, and selectively removing material previously underneath the etch mask between the plurality of openings to produce a desired surface height variation.

Such a method further optionally includes the desired device component structure being defined with a single lithographic patterning step, the desired surface height variation comprising at least one structure with multiple height levels, the desired surface height variation comprising at least one structure with a non-planar surface, the metallic substrate being titanium, the material previously underneath the etch mask being a plurality of lines segments of uniform width, such that removal of the material previously underneath the etch mask is performed simultaneously, and a rate of material removal within each mask opening being further determined by a shape or a pitch of the openings.

The method can further include creating independent electrically active surfaces on the device structures by depositing an electrically insulating layer over the entirety of device structures, and selective depositing a metals on surfaces inclined at less than 90 degrees to a surface plane of the substrate, and the device being selected from a group consisting of a microactuator, a microsensor, a microtransducer, and a microstructure.

A device in accordance with the present invention comprises a microdevice suspended by at least one element, and sloping electrodes underneath the microdevice, the sloping electrodes having a first gap distance near a center of the microdevice that is smaller than a second gap distance near an edge of the microdevice to reduce a drive voltage needed to move the microdevice.

Such a device further optionally includes the at least one element being a torsional or flexural element, the sloping electrodes being created using a single lithographic patterning step, the sloping electrodes further comprise a stepwise linear profile, the stepwise linear profile is generated by selecting at least one quality for an etching opening within the stepwise linear profile, the at least one quality is selected from a group consisting of a size, a shape, and a pitch, the microfabricated device is made on a metallic substrate, the metallic substrate is titanium, and a slope of the sloping electrodes determines the drive voltage required to move the microdevice without sacrificing displacement range and switching speed.

BRIEF DESCRIPTION OF THE DRAWINGS

Referring now to the drawings in which like reference numbers represent corresponding parts throughout:

FIG. 3A illustrates $TiO_2$ mask patterning via PR mask and $CHF_3$-based dry etch; FIG. 3B illustrates anisotropic, Cl-based titanium dry etch; and FIG. 3C illustrates superstructure removal via isotropic HF-based wet etch;

DETAILED DESCRIPTION OF THE INVENTION

Figure 1:
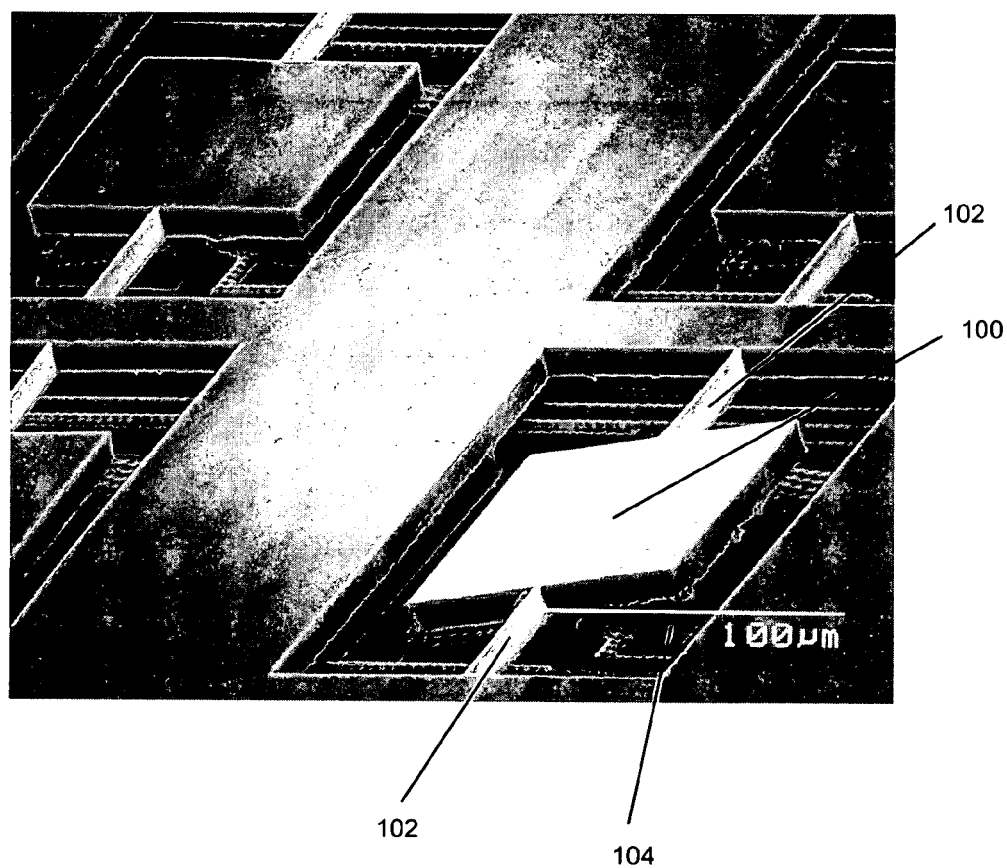
FIG. 1 illustrates a bulk micromachined hybrid titanium/silicon sloping electrode microdevice.

In the following description of the preferred embodiment, reference is made to the accompanying drawings that form a part hereof, and in which is shown by way of illustration a specific embodiment in which the invention may be practiced. It is to be understood that other embodiments may be utilized and structural changes may be made without departing from the scope of the present invention.

Technical Description

The recent development of highly anisotropic metal bulk micromachining processes has provided the opportunity for extension of metal microfabrication capability well into the third dimension [1]. While this capability has enabled fabrication of complex, high aspect ratio structures, these structures are generally simple, prismatic, 3-D projections of the planar mask pattern used to define them. For some applications, however, truly 3-D structures are desired, especially those that posses arbitrary surface height profiles, i.e. surfaces with multiple height levels and/or non-planar profiles. One example of this is the hybrid micromirror (or other microdevice) pictured in FIG. 1, in which a wedge-shaped sloping electrode geometry is used to reduce drive voltage without sacrificing switching speed or mirror displacement range [2]. The device is composed of large bulk titanium mirrors suspended by high aspect ratio titanium springs over single crystal silicon sloping electrodes. Preliminary results have shown that the hybrid devices exhibit acceptable performance, however, the use of silicon for the electrodes may have implications on durability and reliability. The low fracture toughness of silicon may limit shock resistance and residual stresses induced by the thermal expansion mismatch between silicon and titanium could cause distortion or delamination of the mirror structures. Mitigation of issues such as these thus provides the motivation for development of 3-D micromachining processes that enable fabrication of complimentary titanium sloping electrodes.

Single-Mask, 3-D Microfabrication

Realization of 3-D micromechanical structures commonly requires multiple lithographic masking and etching steps, often on surfaces with large topographical variation. This can add significant process complexity, therefore illustrating the need for development of simpler processes. Among the multitude of 3-D micromachining techniques reported in the literature, two general types stand out for their reliance on high-throughput, batch-scale processes that are: a) compatible with conventional semiconductor process technologies; and b) require only a single masking step.

The first of these techniques involves the use of gray-scale lithography to define arbitrary surface height profiles in photoresist that are then transferred into the substrate using anisotropic RIE. This technique has been used to fabricate a variety structures [3,4], however, dependence upon stringent control of both the initial photolithography and the selectivity of the subsequent etching significantly reduces process latitude, which can have implications on reproducibility and yield.

The second batch-scale, single-mask technique for 3-D micromachining relies on the exploitation of RIE Lag, an otherwise undesirable etching phenomena in which transport limitation causes scaling of etch rate, and therefore etch depth, with mask opening size [5]. In this technique, structures are defined by mask patterns composed of assemblages of etch vias of varying size, shape, and pitch. Deliberate modulation of the sizes, shapes, and/or pitch of these vias results in etch depth variation across the pattern, which is then translated into surface height variation through removal of the superstructure above the etched floors. The technique is relatively tolerant of subtle lithographic process variations, and does not depend strongly on selectivity, therefore making it more robust than gray-scale lithography.

Other RIE Lag-based 3-D micromachining techniques have been previously reported in single crystal silicon for the fabrication of microlenses [6] and non-planar electrodes for acoustic ejectors [7]. However, this patent application represents the first known exploitation of RIE lag for 3D micromachining of metallic materials. In the following sections, this process is described and its utility for simplified 3-D metallic micromachining is demonstrated through the fabrication of titanium sloping electrodes.

Fabrication

Figure 2:
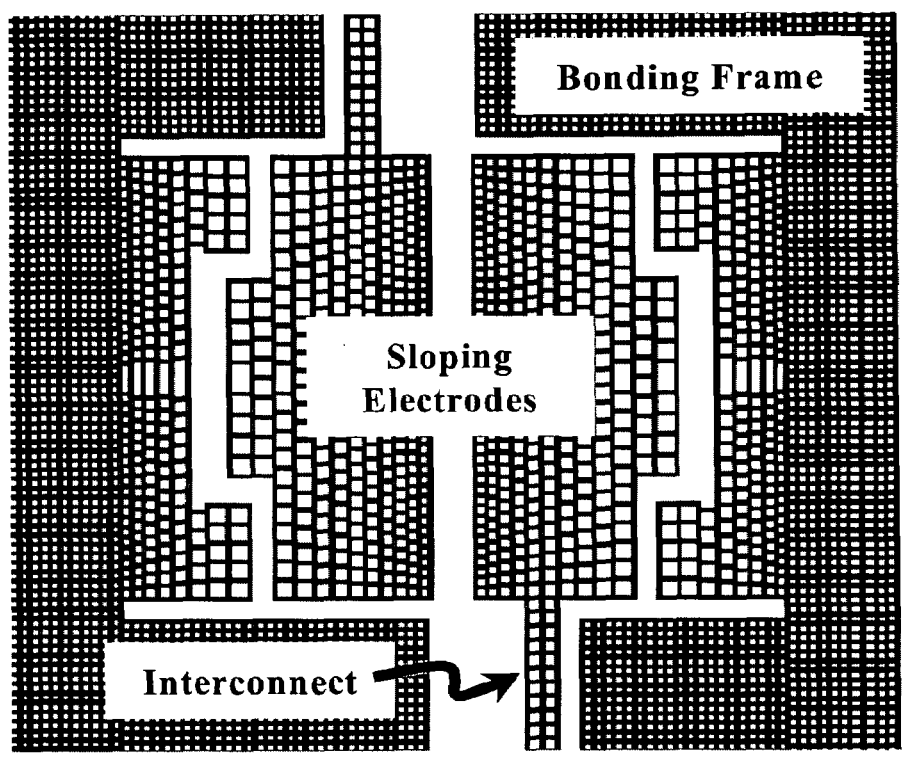
FIG. 2 illustrates a portion of the photolithographic mask pattern used for definition of the titanium sloping electrodes.

The process begins with the deposition of a $TiO_2$ etch mask on a polished bulk titanium substrate using DC reactive sputtering of a titanium target in an oxygen environment. The mask is then patterned using standard lithographic techniques. All components of the device are patterned in this step, therefore eliminating the need for additional lithographic steps later in the process. FIG. 2 shows a portion of the lithographic mask pattern used. The pattern is primarily composed of square etch vias, ranging in size from 1.5 μm to 4.5 μm, with line widths fixed at 1 μm throughout to facilitate superstructure removal at a later stage in the process.

Figure 3A:
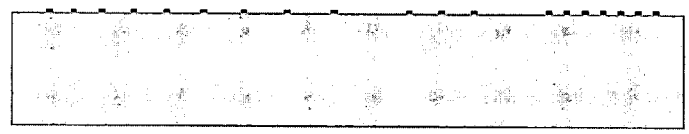
FIGS. 3A-3C illustrate titanium sloping electrode process flow.
Figure 3B:
Figure 3C:

The lithographic pattern is transferred to the mask oxide (FIG. 3a) using a $CHF_3$-based dry etch, and then anisotropically dry etched into the underlying titanium substrate (FIG. 3b) using the recently developed Titanium ICP Deep Etch (TIDE) Process [8]. The TIDE Process enables highly anisotropic etching of bulk titanium using a high density Cl/Ar-based plasma and provides etch rates of up to 2 μm/min with good mask selectivity (~45:1 Ti:$TiO_2$). After deep etching, the superstructure above the etched floor is removed using hydrofluoric acid (HF) wet etching (FIG. 3c), thus yielding a surface whose topography is defined by the previous etch depth variation.

Figure 4:
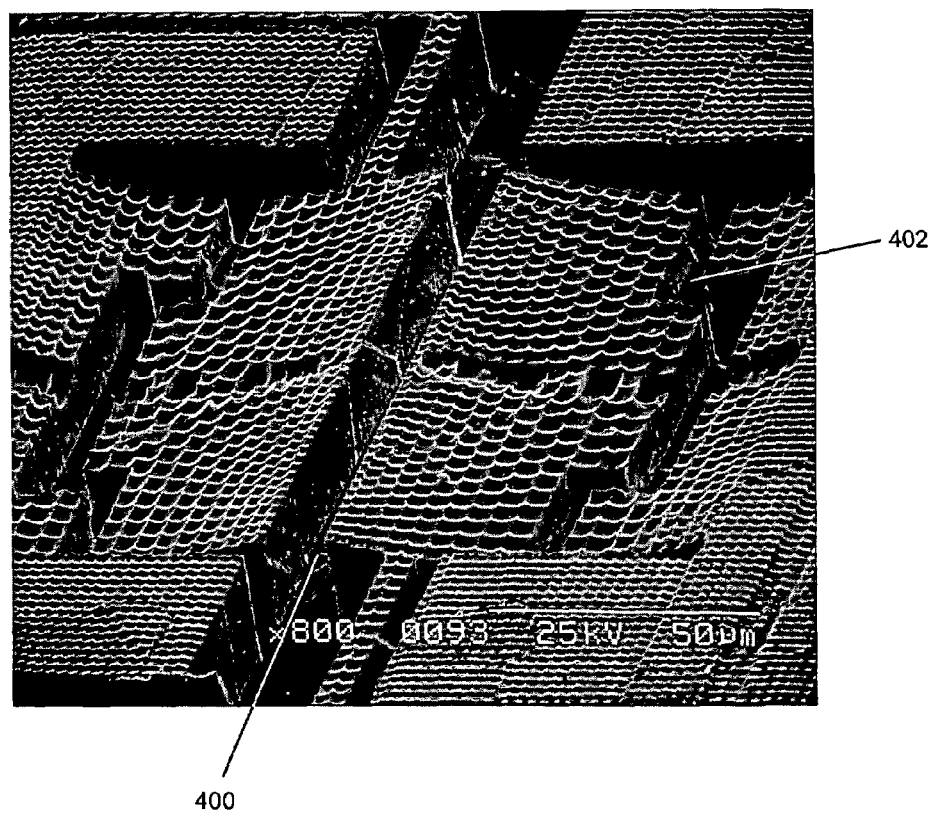
FIG. 4 illustrates bulk titanium sloping electrode structure.
Figure 5:
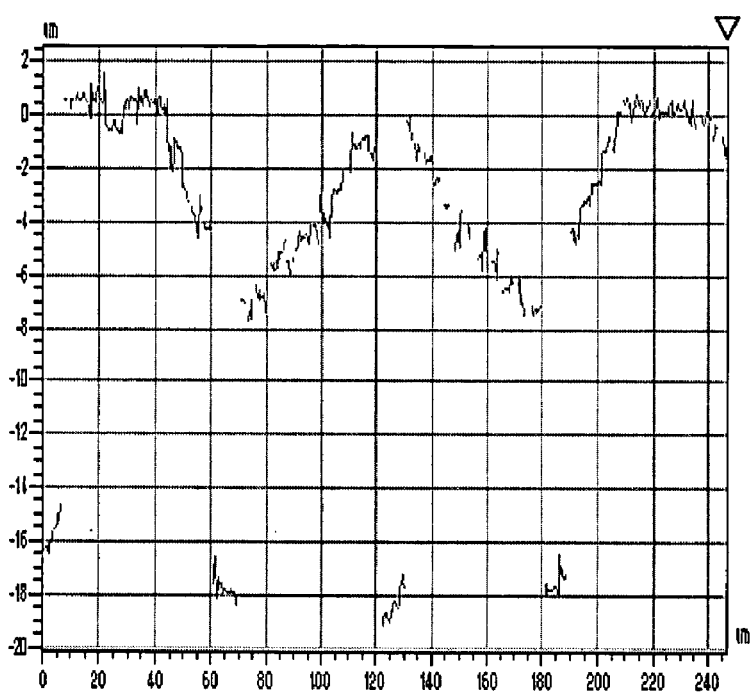
FIG. 5 illustrates an optical profilometry scan of titanium sloping electrode structure pictured in FIG. 4.

FIGS. 4 and 5 show a scanning electron micrograph and optical profilometry scan, respectively, of the completed titanium sloping electrode structure. As can be seen, complex structures with multiple height levels and sloping surfaces have been simply defined using only a single lithographic masking step, thus demonstrating the capability of the technique.

The device understructure shown in FIG. 4, and the device shown in FIG. 1, illustrate a device in accordance with the present invention, where a microdevice 100 is suspended by at least one flexural or torsional element 102, and the sloping electrodes 104 underneath the microdevice 100, the sloping electrodes 104 having a first gap distance near a center of the microdevice, near trench 400, that is smaller than a second gap distance near an edge of the microdevice, near trench 402, to reduce a drive voltage needed to move the microdevice 100.

Discussion

Figure 6:
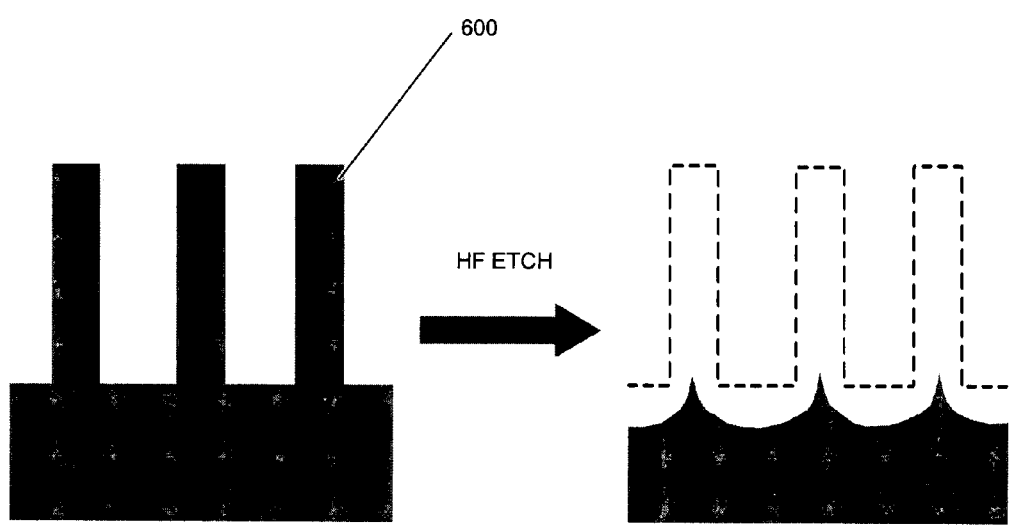
FIG. 6 illustrates the origin of surface roughness observed in FIG. 4.

Despite the demonstrated versatility of this process for simplified fabrication of complex 3D structures in bulk titanium, minimization of surface roughness could prove problematic for some applications. As illustrated in FIG. 6, the lateral convergence of etch fronts from adjacent trenches during the superstructure 600 removal results in the formation of sharp, peak-like protrusions beneath the original superstructure 600 sidewalls. The magnitude of this roughness could be reduced with further HF etching. However, the isotropic nature of such smoothing would also reduce the cross-section of fine features, such as the thin interconnect lines, which could comprise their structural integrity. As a result, the degree of surface roughness reduction that could be achieved would be constrained by the degree of cross-sectional thinning that could be tolerated. Although such roughness was not a concern for the previous silicon-based sloping electrodes ($R_a$~100 nm) it can cause difficulties for the current titanium sloping electrodes, as will be discussed below.

Upon completion of the superstructure 600 removal, the superstructure 600 being the area that was formerly underneath the etch mask, physical definition of all structures is complete. For the case of the sloping electrode structure, however, further steps are needed to create the electrically active, but isolated surfaces required for electrostatic actuation of the microdevice device. In the prior silicon-based electrodes thermal oxidation was used to electrically isolate the surfaces of the device from the underlying substrate. Blanket gold deposition via e-beam evaporation was then performed to create electrically active surfaces on top of the structures. The tall, vertical sidewalls of the structures, coupled with the poor step-coverage of the e-beam deposition, prevented continuity of metallization between the upper surfaces of the structures and the substrate below. This resulted in self-definition of electrically isolated structures on the upper surfaces of the structures, which therefore eliminated the need for additional patterning on surfaces with large surface height variation.

Figure 7:
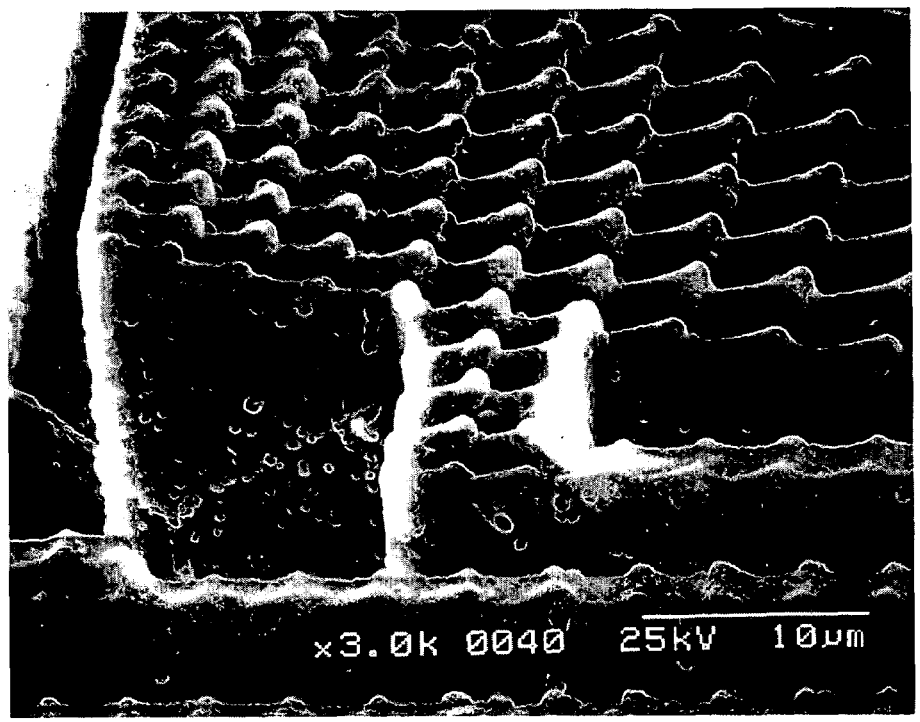
FIG. 7 illustrates a titanium sloping electrode structure covered by 1 μm blanket $SiO_2$ deposition by PECVD at 250° C.

A similar isolation scheme could be applied towards the current titanium-based sloping electrodes. However, in this case, a deposited insulator must be substituted for the thermal oxide insulation layer used in the silicon electrodes, due to the semiconducting nature of $TiO_2$. FIG. 7 shows the initial results of such a process in which 1 μm of $SiO_2$ has been deposited on the titanium electrode structure by RIE-based PECVD at 250° C. It is immediately apparent that the oxide deposition is rather non-uniform, as evidenced by nodular deposition on both the sidewalls and the sharp peak-like protrusions on the upper surfaces of the sloping electrode. Such non-uniformity was not an issue in the previous silicon-based electrodes because growth of thermal oxide enabled preservation of the original surface contours.

The presence of these nodular deposits on the sharp peaks of the bonding frame surfaces could detrimentally affect the uniformity of the mirror/electrode gap in the final micromirror devices by locally impeding bonding between the mirror layer and electrode substrate. The presence of such nodules on the sloping electrode surfaces could also cause undesired contact between the electrode and the mirror, therefore enabling shorting to occur, particularly in areas close to the apex of the sloping electrodes where the mirror/electrode gap can be as small as 1 μm. Improvement of the conformality of the oxide deposition, through process optimization and/or migration to a more capable ICP-based deposition system, would likely reduce the size and extent of the nodules. However, it is highly unlikely that nodular deposition on the sharp peak-like protrusions could be eliminated altogether. Nodule formation could also be mitigated by smoothing of the sharp peaks through additional wet etching before oxide deposition. However, as discussed earlier, such smoothing would likely be at the expense of the thin interconnect lines.

The reliability of the deposition-based isolation scheme described above could also be detrimentally affected by the large thermal expansion mismatch between the deposited oxide and the underlying titanium. This mismatch would result in the generation of considerable residual stress within the oxide, which could cause cracking or delamination of the layer. Substitution of $Si_3N_4$ for $SiO_2$ in this isolation scheme would reduce residual stress, due to the smaller thermal mismatch differential. However, even at reduced levels such stresses might still cause distortion or delamination of the mirror layer, especially with repeated temperature cycling, thus suggesting the need for consideration of alternate isolation schemes.

Figure 8:
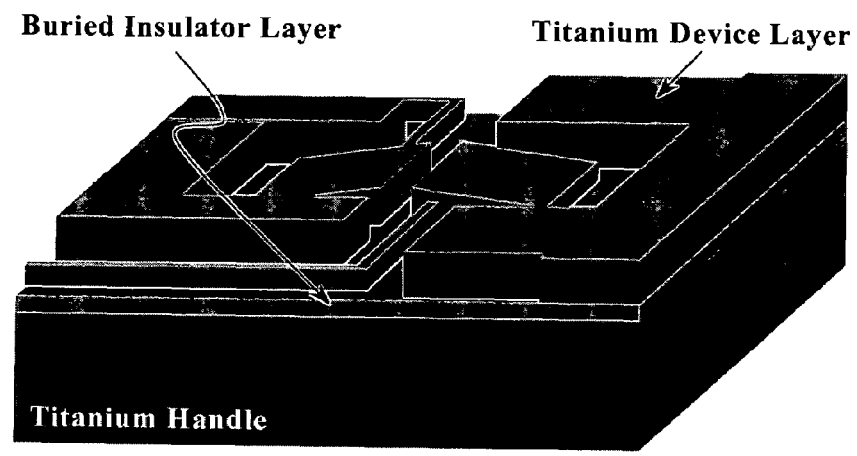
FIG. 8 illustrates a Titanium-On-Insulator-based sloping electrode concept, where electrode structures are isolated from one another and handle substrate below by the buried insulator layer.

One such scheme relies on the use of a Titanium-on-Insulator (TOI) substrate for the sloping electrode structure, as illustrated in FIG. 8. Much like its silicon-based counterpart, a TOI substrate would consist of a thin titanium device layer separated from a thicker titanium handle by a thin buried insulator layer. Utilization of a TOI substrate would eliminate the need for deposition of the insulator and conductor layers required for the previous isolation scheme because electrical isolation would be provided by the physical separation of the structures from one another and the substrate below by the buried insulator layer. A TOI-based isolation scheme might also allow for direct bonding of the titanium mirror layer to the electrode structure without the need for any intermediate layers, therefore enabling the fabrication of a nearly monolithic titanium micromirror device. Such a device would be inherently more reliable and robust due to the elimination of thermal expansion mismatch-induced residual stresses.

Process Chart

Figure 9:
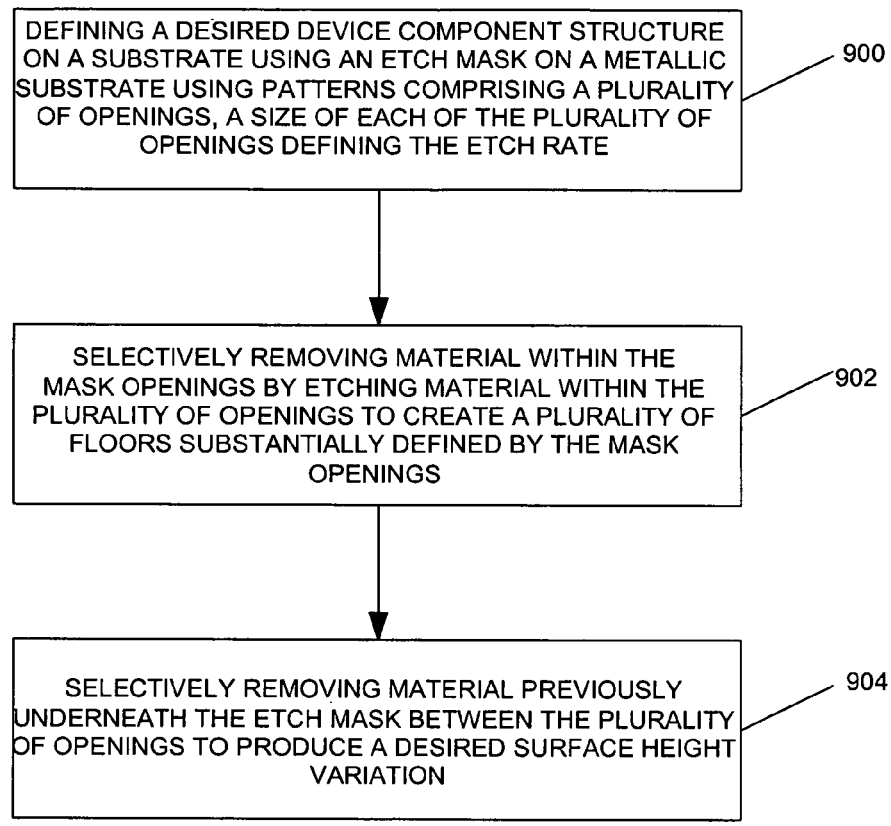
FIG. 9 illustrates a process chart in accordance with the present invention.

FIG. 9 illustrates a process chart in accordance with the present invention.

Box 900 illustrates defining a desired device component structure on a substrate using an etch mask on a metallic substrate using patterns comprising a plurality of openings, a size of each of the plurality of openings defining the etch rate.

Box 902 illustrates selectively removing material within the mask openings by etching material within the plurality of openings to create a plurality of floors substantially defined by the mask openings.

Box 904 illustrates selectively removing material previously underneath the etch mask between the plurality of openings to produce a desired surface height variation.

CONCLUSION

This concludes the description of the preferred embodiment of the present invention. The foregoing description of one or more embodiments of the invention has been presented for the purposes of illustration and description. It is not intended to be exhaustive or to limit the invention to the precise form disclosed. Many modifications and variations are possible in light of the above teaching, without fundamentally deviating from the essence of the present invention. It is intended that the scope of the invention be limited not by this detailed description, but rather by the claims appended hereto and the equivalents of the claims.

A method in accordance with the present invention comprises defining a desired device component structure on a substrate using an etch mask on a metallic substrate using patterns comprising a plurality of openings, a size of each of the plurality of openings defining the etch rate, selectively removing material within the mask openings by etching material within the plurality of openings to create a plurality of floors substantially defined by the mask openings, and selectively removing material previously underneath the etch mask between the plurality of openings to produce a desired surface height variation.

Such a method further optionally includes the desired device component structure being defined with a single lithographic patterning step, the desired surface height variation comprising at least one structure with multiple height levels, the desired surface height variation comprising at least one structure with a non-planar surface, the metallic substrate being titanium, the material previously underneath the etch mask being a plurality of lines segments of uniform width, such that removal of the material previously underneath the etch mask is performed simultaneously, and a rate of material removal within each mask opening being further determined by a shape or a pitch of the openings.

The method can further include creating independent electrically active surfaces on the device structures by depositing an electrically insulating layer over the entirety of device structures, and selective depositing of metals on surfaces inclined at less than 90 degrees to a surface plane of the substrate, and the device being selected from a group consisting of a microactuator, a microsensor, a microtransducer, and a microstructure.

A device in accordance with the present invention comprises a microdevice suspended by at least one element, and sloping electrodes underneath the microdevice, the sloping electrodes having a first gap distance near a center of the microdevice that is smaller than a second gap distance near an edge of the microdevice to reduce a drive voltage needed to move the microdevice.

Such a device further optionally includes the at least one element being a torsional or flexural element, the sloping electrodes being created using a single lithographic patterning step, the sloping electrodes further comprise a stepwise linear profile, the stepwise linear profile is generated by selecting at least one quality for an etching opening within the stepwise linear profile, the at least one quality is selected from a group consisting of a size, a shape, and a pitch, the microfabricated device is made on a metallic substrate, the metallic substrate is titanium, and a slope of the sloping electrodes determines the drive voltage required to move the microdevice without sacrificing displacement range and switching speed.

What is claimed is:

1. A microfabricated device, comprising:
a microdevice suspended by at least one element; and
sloping electrodes underneath the microdevice, the sloping electrodes having a first gap distance near a center of the microdevice that is smaller than a second gap distance near an edge of the microdevice to reduce a drive voltage needed to move the microdevice, wherein a slope of the sloping electrodes determines the drive voltage to move the microdevice without sacrificing displacement range and switching speed.

2. The microfabricated device of claim 1, wherein the at least one element is a torsional element.

3. The microfabricated device of claim 1, wherein the at least one element is a flexural element.

4. The microfabricated device of claim 1, wherein the sloping electrodes are created using a single lithographic patterning step.

5. The microfabricated device of claim 1, wherein the sloping electrodes further comprise a stepwise linear profile.

6. The microfabricated device of claim 5, wherein the stepwise linear profile is generated by selecting at least one quality for an etching opening within the stepwise linear profile.

7. The microfabricated device of claim 6, wherein the at least one quality is selected from a group consisting of a size, a shape, and a pitch.

8. The microfabricated device of claim 1, wherein the microfabricated device is made on a metallic substrate.

9. The microfabricated device of claim 8, wherein the metallic substrate is titanium.

\* \* \* \* \*